(12) United States Patent
Taufique et al.

(10) Patent No.: US 8,059,441 B2
(45) Date of Patent: Nov. 15, 2011

(54) MEMORY ARRAY ON MORE THAN ONE DIE

(75) Inventors: Mohammed H. Taufique, Austin, TX (US); Derwin Jallice, Austin, TX (US); Donald W. McCauley, Lakeway, TX (US); John P. DeVale, Austin, TX (US); Edward A. Brekelbaum, Columbia, MD (US); Jeffrey P. Rupley, II, Round Rock, TX (US); Gabriel H. Loh, Atlanta, GA (US); Bryan Black, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/709,620

(22) Filed: Feb. 22, 2010

(65) Prior Publication Data

US 2010/0149849 A1 Jun. 17, 2010

Related U.S. Application Data

(63) Continuation of application No. 11/771,054, filed on Jun. 29, 2007, now Pat. No. 7,692,946.

(51) Int. Cl.
*G11C 5/06* (2006.01)
(52) U.S. Cl. .............................. 365/63; 365/191; 365/51
(58) Field of Classification Search .................... 365/63, 365/191, 51
See application file for complete search history.

(56) References Cited

U.S. PATENT DOCUMENTS

| | | | |
|---|---|---|---|
| 7,692,946 B2 | 4/2010 | Taufique et al. | |
| 2004/0256638 A1 | 12/2004 | Perego et al. | |
| 2005/0127490 A1 | 6/2005 | Black et al. | |
| 2005/0236703 A1* | 10/2005 | Kazi et al. | 257/678 |
| 2007/0055917 A1 | 3/2007 | Kashiwaya | |
| 2007/0220207 A1 | 9/2007 | Black et al. | |
| 2007/0275539 A1 | 11/2007 | Rashid et al. | |
| 2008/0017971 A1 | 1/2008 | Hollis | |
| 2008/0054493 A1 | 3/2008 | Leddige et al. | |
| 2008/0150088 A1 | 6/2008 | Reed et al. | |
| 2008/0152356 A1 | 6/2008 | Somasekhar et al. | |
| 2008/0155196 A1 | 6/2008 | Black et al. | |
| 2009/0138688 A1 | 5/2009 | Black et al. | |

OTHER PUBLICATIONS

Black, Bryan, et al., "3D Processing Technology and its Impact on iA32 Microprocessors", IEEE International Conference on Computer Design, pp. 316-318, 2004.

Black, Bryan, et al., "Die Stacking (3D) Microarchitecture", IEEE ACM International Symposium on Microarchitecture, pp. 469-479, Dec. 2006.

Healy, Michael, et al., "Multiobjective Microarchitectural Floorplanning for 2-D and 3-D ICs", IEEE Transactions on Computer-Aided Design of Integrated Circuits and Systems, vol. 26, No. 1, pp. 38-52, Jan. 2007.

Healy, Michael, et al., "Microarchitectural Floorplanning Under Performance and Thermal Tradeoff", Proceedings of Design, Automation and Test in Europe, pp. 1288-1293; Mar. 6-10, 2006.

(Continued)

*Primary Examiner* — Thong Q Le
(74) *Attorney, Agent, or Firm* — Guojun Zhou

(57) ABSTRACT

For one disclosed embodiment, an apparatus may comprise a first die including a first plurality of memory cells for a memory array and a second die including a second plurality of memory cells for the memory array. The second die may include a shared line for the memory array to conduct digital signals for memory cells of both the first and second plurality of memory cells. Other embodiments are also disclosed.

22 Claims, 8 Drawing Sheets

OTHER PUBLICATIONS

Loh, Gabriel H., et al., "Processor Design in 3D Die-Stacking Technologies", IEEE Micro, vol. 27, No. 3, pp. 31-48, May-Jun. 2007.

Puttaswamy, Kiran, et al., "Dynamic Instruction Schedulers in a 3-Dimensional Integration Technology", Great Lakes Symposium on VLSI, pp. 153-158, Apr. 30-May 2, 2006.

Puttaswamy, Kiran, et al., "Implementing Caches in a 3D Technology for High Performance Processors", IEEE International Conference on Computer Design: VLSI in Computers and Processors, pp. 525-532, Oct. 2-5, 2005.

Puttaswamy, Kiran, et al., "Implementing Register Files for High-Performance Microprocessors in a Die-Stacked (3D) Technology", IEEE Computer Society Annual Symposium on Emerging VLSI Technologies and Architectures, 6 pages, Mar. 2-3, 2006.

Puttaswamy, Kiran, et al., "Scalability of 3D-Integrated Arithmetic Units in High-Performance Microprocessors", ACM IEEE Design Automation Conference, pp. 622-625, Jun. 4-8, 2007.

Puttaswamy, Kiran, et al., "The Impact of 3-Dimensional Integration on the Design of Arithmetic Units", IEEE International Symposium on Circuits and Systems, 4 pages, May 2006.

Puttaswamy, Kiran, et al., 'Thermal Analysis of a 3D Die-Stacked High-Performance Microprocessor', Great Lakes Symposium on VLSI, pp. 19-24, Apr. 30-May 2, 2006.

Puttaswamy, Kiran, et al., "Thermal Herding: Microarchitecture Techniques for Controlling Hotspots in High-Performance 3D-Integrated Processors", International Symposium on High-Performance Computer Architecture, pp. 193-204, Feb. 10-14, 2007.

Reed, Paul, et al., "Design Aspects of a Microprocessor Data Cache using 3D Die Interconnect Technology", IEEE International Conference on Integrated Circuit Design and Technology, pp. 15-18, May 9-11, 2005.

Tsai, Yuh-Fang, et al., "Three-Dimensional Cache Design Exploration Using 3DCacti", IEEE International Conference on Computer Design: VLSI in Computers and Processors, pp. 519-524, Oct. 2-5, 2005.

Xie, Yuan, et al., "Design Space Exploration for 3D Architectures", ACM Journal on Emerging Technologies in Computing Systems, vol. 2, No. 2, pp. 65-103, Apr. 2006.

Anonymous, "Method for Effectively Using the Through-Silicon Via-Interconnect Area for Clock Distribution in a 3-D Multistrata IC", IP.com Publication No. IPCOM000125119D, pages, May 19, 2005.

\* cited by examiner

MEMORY ARRAY ON MORE THAN ONE DIE

The present patent application is a Continuation of Application No. 11/771,054, filed Jun. 29, 2007, now issued as U.S. Pat. No. 7,692,946, which is incorporated by reference in this application.

FIELD

Embodiments described herein generally relate to memory.

BRIEF DESCRIPTION OF THE DRAWINGS

Embodiments are illustrated by way of example and not limitation in the figures of the accompanying drawings, in which like references indicate similar elements and in which.

The figures of the drawings are not necessarily drawn to scale.

DETAILED DESCRIPTION

The following detailed description sets forth example embodiments of apparatuses, methods, and systems relating to a memory array on more than one die. Features, such as structure(s), function(s), and/or characteristic(s) for example, are described with reference to one embodiment as a matter of convenience; various embodiments may be implemented with any suitable one or more described features.

Figure 1:
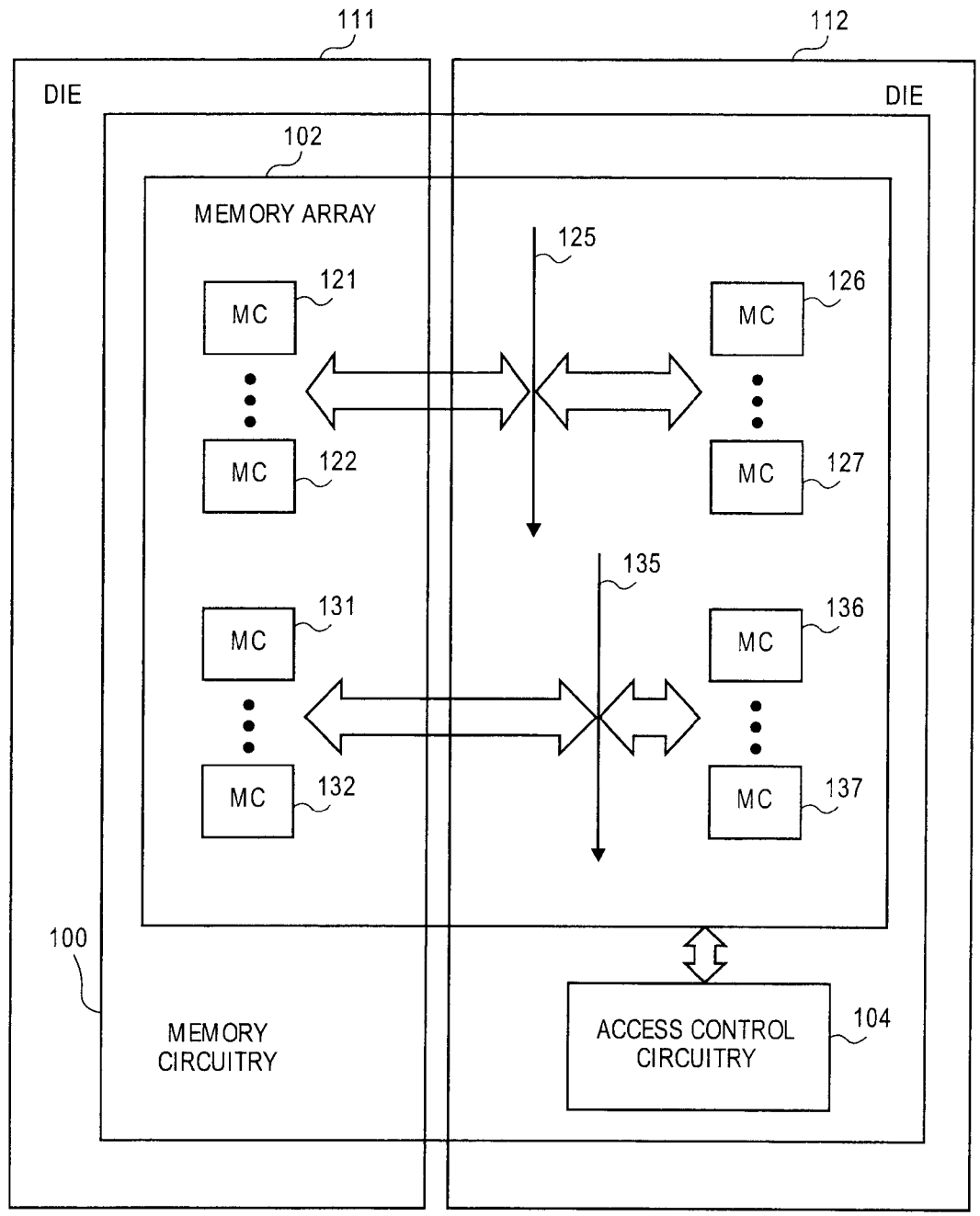
FIG. 1 illustrates, for one embodiment, a block diagram of memory circuitry including a memory array having memory cells on two dice with one die including a shared line to conduct digital signals for memory cells on both dice.

FIG. 1 illustrates, for one embodiment, memory circuitry 100 including a memory array 102 having memory cells (MC's), such as memory cells 121 and 126 for example, and access control circuitry 104 coupled to control access to memory cells of memory array 102. Memory array 102 for one embodiment may have a plurality of memory cells on a first die 111 and a plurality of memory cells on a second die 112. Die 112 for one embodiment may include one or more shared lines, such as a shared line 125 for example, for memory array 102 to conduct digital signals for memory cells on both die 111 and die 112.

Die 111 for one embodiment may have a plurality of memory cells, such as memory cells 121 and 122 for example, coupled to shared line 125 on die 112, and die 112 for one embodiment may have a plurality of memory cells, such as memory cells 126 and 127 for example, coupled to shared line 125. Die 111 may have any suitable number of any suitable memory cells coupled to shared line 125, and die 112 may have any suitable number of any suitable memory cells coupled to shared line 125.

Shared line 125 may be used to conduct any suitable digital signals for memory cells on die 111 and die 112. Shared line 125 for one embodiment may be a bit line to conduct digital data signals for memory cells on die 111 and die 112. Shared line 125 for one embodiment may be a local bit line. Shared line 125 for one embodiment may be a global bit line. Shared line 125 for one embodiment may be a control line to conduct digital control signals for memory cells on die 111 and die 112. Shared line 125 for one embodiment may be used to conduct digital control signals to select memory cells on die 111 and die 112. Shared line 125 for one embodiment may be used to conduct one or more match signals for memory cells on die 111 and die 112, for example where memory circuitry 100 for one embodiment may have a content addressable memory architecture.

Coupling memory cells of die 111 to shared line 125 of die 112 for one embodiment may help allow shared line 125 to be designed to conduct digital signals for a given number of memory cells with a relatively shorter length as compared, for example, to the length shared line 125 would have to conduct digital signals for the same given number of memory cells if they were all on die 112. Die 111 and die 112 for one embodiment may be stacked to help increase transistor density and therefore help allow shared line 125 to be designed with a relatively shorter length.

Designing shared line 125 with a relatively shorter length for one embodiment may help reduce its resistance and capacitance. Designing shared line 125 with a relatively shorter length for one embodiment may therefore help allow a reduction in the size of driving and/or pull-down transistors for shared line 125. Designing shared line 125 with a relatively shorter length for one embodiment may therefore help reduce power consumption and/or latency of shared line 125 and may therefore help improve performance. Reducing latency for one embodiment may help allow repeaters and/or repeating latches to be removed as pipestages are eliminated.

Viewed another way, coupling memory cells of die 111 to shared line 125 of die 112 for one embodiment may help allow shared line 125 to be designed to conduct digital signals for a relatively larger number of memory cells as compared, for example, to the number of memory cells shared line 125 of equal length would conduct digital signals for if such memory cells were all on die 112.

Memory array 102 for one embodiment may have any suitable number of one or more shared lines to conduct digital signals for any suitable number of memory cells of die 111 and any suitable number of memory cells of die 112.

As illustrated in FIG. 1, die 111 for one embodiment may also have a plurality of memory cells, such as memory cells 131 and 132 for example, coupled to a shared line 135 on die 112, and die 112 for one embodiment may have a plurality of memory cells, such as memory cells 136 and 137 for example, coupled to shared line 135. Die 111 may have any suitable number of any suitable memory cells coupled to shared line 135, and die 112 may have any suitable number of any suitable memory cells coupled to shared line 135. Shared line 135 may or may not be similarly used as shared line 125. Shared line 125 and shared line 135 may or may not be used to conduct the same type of digital signals. Shared line 125 and shared line 135 may or may not conduct digital signals for the same number and/or type of memory cells.

For one embodiment, one or more memory cells of die 111 and/or die 112 may be coupled to more than one shared line that is on die 112 and that is to conduct digital signals. A memory cell of die 111, for example, may be coupled to a shared line that is to conduct one or more digital data signals for the memory cell and to another shared line that is to conduct one or more digital control signals for the memory cell.

Although described in connection with die 112 having one or more shared lines to conduct digital signals for memory cells on both die 111 and die 112, die 111 for one embodiment may similarly have one or more shared lines to conduct digital signals for memory cells on both die 111 and die 112. For one embodiment, only die 111 or die 112 may have one or more shared lines. For another embodiment, both die 111 and die 112 may have one or more shared lines.

Although access control circuitry 104 is illustrated on die 112 for one embodiment, access control circuitry 104 for another embodiment may be on die 111. Access control circuitry 104 for another embodiment may be spread across both die 111 and die 112.

Coupling of Memory Cells to Shared Line

Memory cells of die 111 and die 112 may be coupled to a shared line of die 112 in any suitable manner.

Figure 2:
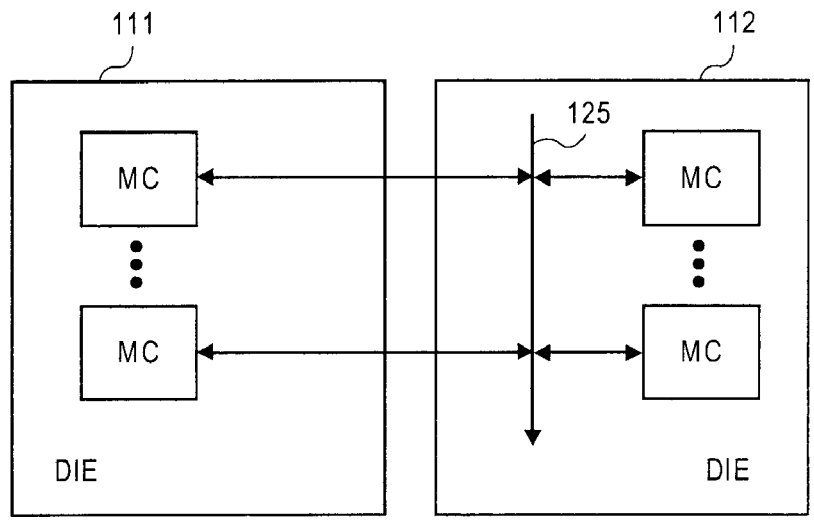
FIG. 2 illustrates, for one embodiment, a block diagram of memory cells of two dice separately coupled to a shared line of one die.

As illustrated in FIG. 2, a plurality of memory cells of die 111 for one embodiment may be separately coupled to shared line 125 of die 112 at different respective positions along shared line 125. A plurality of memory cells of die 112 for one embodiment may also be separately coupled to shared line 125 at different respective positions along shared line 125.

Figure 3:
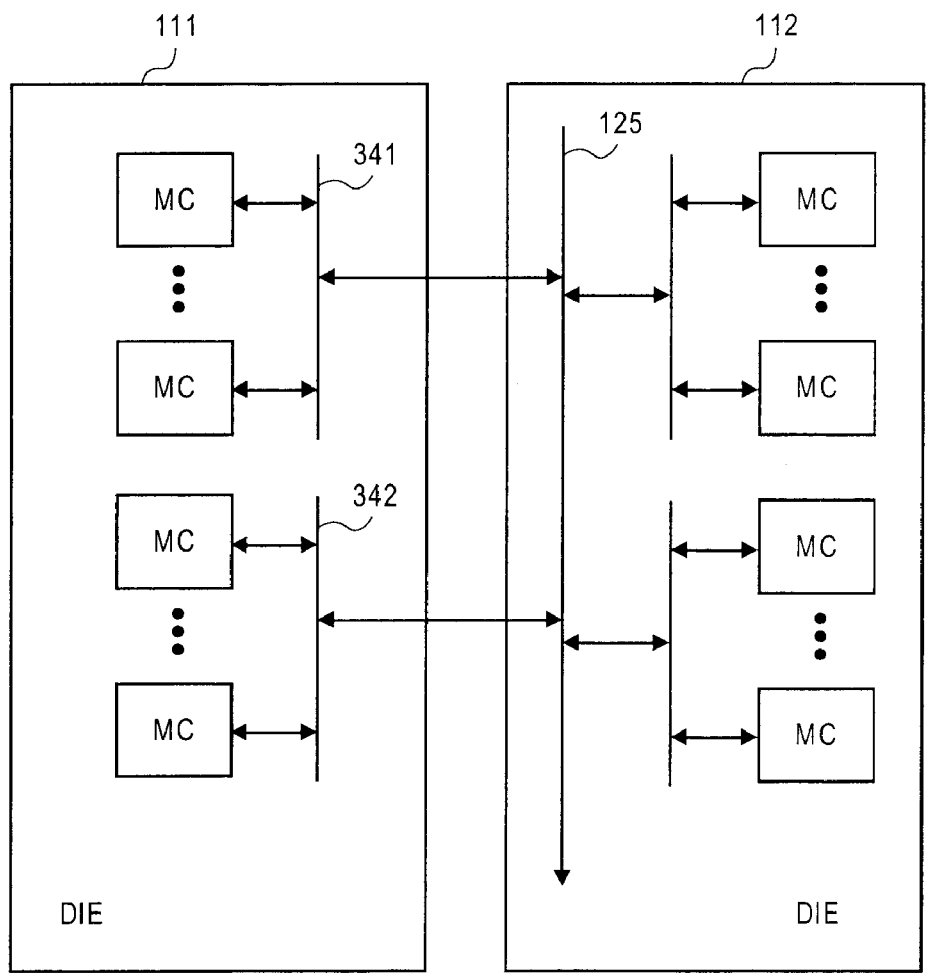
FIG. 3 illustrates, for one embodiment, a block diagram of memory cells of two dice coupled to a shared line of one die through another line.

As illustrated in FIG. 3, a plurality of memory cells of die 111 for one embodiment may be separately coupled to a line 341 of die 111 at different respective positions along line 341, and line 341 may be coupled to shared line 125 of die 112. For one embodiment, another plurality of memory cells of die 111 may be separately coupled to another line 342 of die 111 at different respective positions along line 342, and line 342 may be separately coupled to shared line 125 of die 112 at a position different from that at which line 341 is coupled to shared line 125. Die 111 for one embodiment may have memory cells coupled to shared line 125 of die 112 in this manner through any suitable number of one or more lines on die 111. Die 112 for one embodiment may have memory cells coupled to shared line 125 of die 112 in this manner through any suitable number of one or more lines on die 112.

Figure 4:
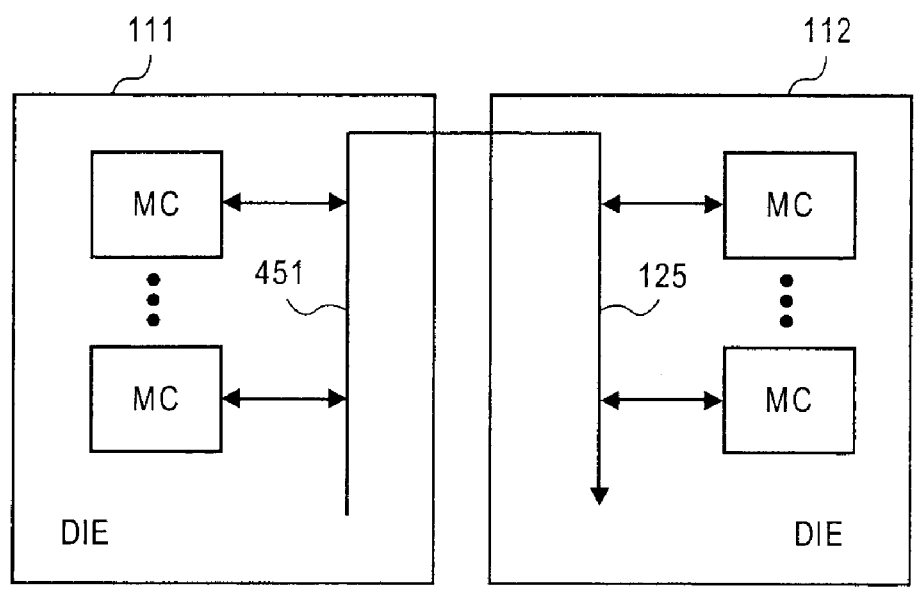
FIG. 4 illustrates, for one embodiment, a block diagram of two dice with one die including a shared line to conduct digital signals for memory cells on both dice and the other die including another line to extend the shared line across both dice.

As illustrated in FIG. 4, a plurality of memory cells of die 111 for one embodiment may be separately coupled to a line 451 of die 111 at different respective positions along line 451, and line 451 may be coupled to shared line 125 of die 112 to extend shared line 125 across both die 111 and die 112. A plurality of memory cells of die 112 for one embodiment may be separately coupled to shared line 125 at different respective positions along shared line 125.

Memory cells of die 111 coupled to the same shared line of die 112 may or may not be coupled to that same shared line in the same or a similar manner. As one example, die 111 may have one or more memory cells coupled to a shared line of die 112 similarly as shown in FIG. 2 and have memory cells coupled to that same shared line of die 112 similarly as shown in FIG. 3. Memory cells of die 112 coupled to the same shared line of die 112 may or may not be coupled to that same shared line in the same or a similar manner. Memory cells of die 111 coupled to a shared line of die 112 may or may not be coupled to that shared line in the same or a similar manner as memory cells of die 112 are coupled to that same shared line.

Die 111 and/or die 112 for one embodiment may include any suitable switching, driving, and/or buffer circuitry coupled to conduct one or more signals between one or more memory cells on die 111 and one or more shared lines on die 112. Die 112 for one embodiment may include any suitable switching, driving, and/or buffer circuitry coupled to conduct one or more signals between one or more memory cells on die 112 and one or more shared lines on die 112.

Die 111 and die 112 may be positioned relative to one another and coupled to one another in any suitable manner to couple memory cells of die 111 to one or more shared lines of die 112.

Figure 5:
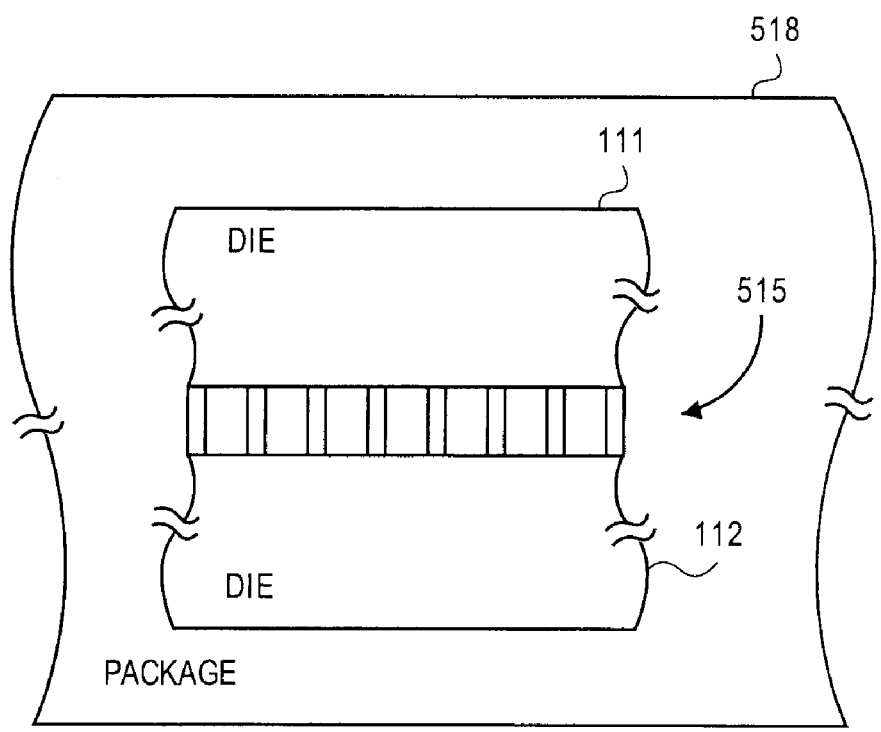
FIG. 5 illustrates, for one embodiment, two dice in accordance with FIGS. 1-4 with at least a portion of one die positioned over at least a portion of the other die and coupled to the other die.

For one embodiment, as illustrated in FIG. 5, at least a portion of die 111 may be positioned over at least a portion of die 112. Die 111 and die 112 for one embodiment may be stacked. Die 111 for one embodiment may have a smaller surface area at its top or bottom relative to the top of die 112. All of die 111 for one embodiment may then be positioned over a portion of die 112. For one embodiment, one or more conductive areas at the top of die 111 may be coupled to one or more conductive areas at the top of die 112 to couple memory cells of die 111 to one or more shared lines of die 112.

Die 111 for one embodiment may be coupled to die 112 using any suitable 3-dimensional (3D) process technology. Die 111 for one embodiment may be fused to die 112. Die 111 for one embodiment may be coupled to die 112 after both die 111 and die 112 have been separated from respective wafers, that is coupled as part of a die-to-die technique. Die 111 for one embodiment may be coupled to die 112 prior to both die 111 and die 112 being separated from respective wafers, that is coupled as part of a wafer-to-wafer technique. Die 111 for one embodiment may be coupled to die 112 after die 111 has been separated from a wafer yet prior to die 112 being separated from a wafer, that is coupled as part of a die-to-wafer technique.

Die 111 for one embodiment may be coupled to die 112 to couple memory cells of die 111 to one or more shared lines of die 112 with one or more via interconnects, such as via interconnects 515 of FIG. 5 for example. As one example, such via interconnect(s) for one embodiment may be formed by forming a via interconnect layer over a top conductive layer of die 111 and/or die 112 and then bonding the tops of die 111 and die 112 following alignment. For one embodiment where a plurality of memory cells of die 111 are separately coupled to a shared line of die 112 at different respective positions along that shared line, such memory cells of die 111 may be coupled to the shared line with corresponding via interconnects. For one embodiment where a plurality of memory cells of die 111 are separately coupled to a line of die 111 at different respective positions along that line, that line may be coupled to a shared line of die 112 with one or more via interconnects.

Die 111 and die 112 for one embodiment, as illustrated in FIG. 5, may be packaged together in a same package 518. Die 111 and die 112 for one embodiment may be packaged together using any suitable packaging technique.

Although described in connection with die 111 being positioned over and coupled to die 112, die 112 for one embodiment may be positioned over and coupled to die 111.

As used in this detailed description, directional terms such as, for example, top and over are used for convenience relative to one frame of reference regardless of how die 111 and/or die 112 may be oriented in space.

Shared Bit Line

Die 112 for one embodiment may include one or more shared bit lines for memory array 102 to conduct digital data signals for memory cells on both die 111 and die 112.

Figure 6:
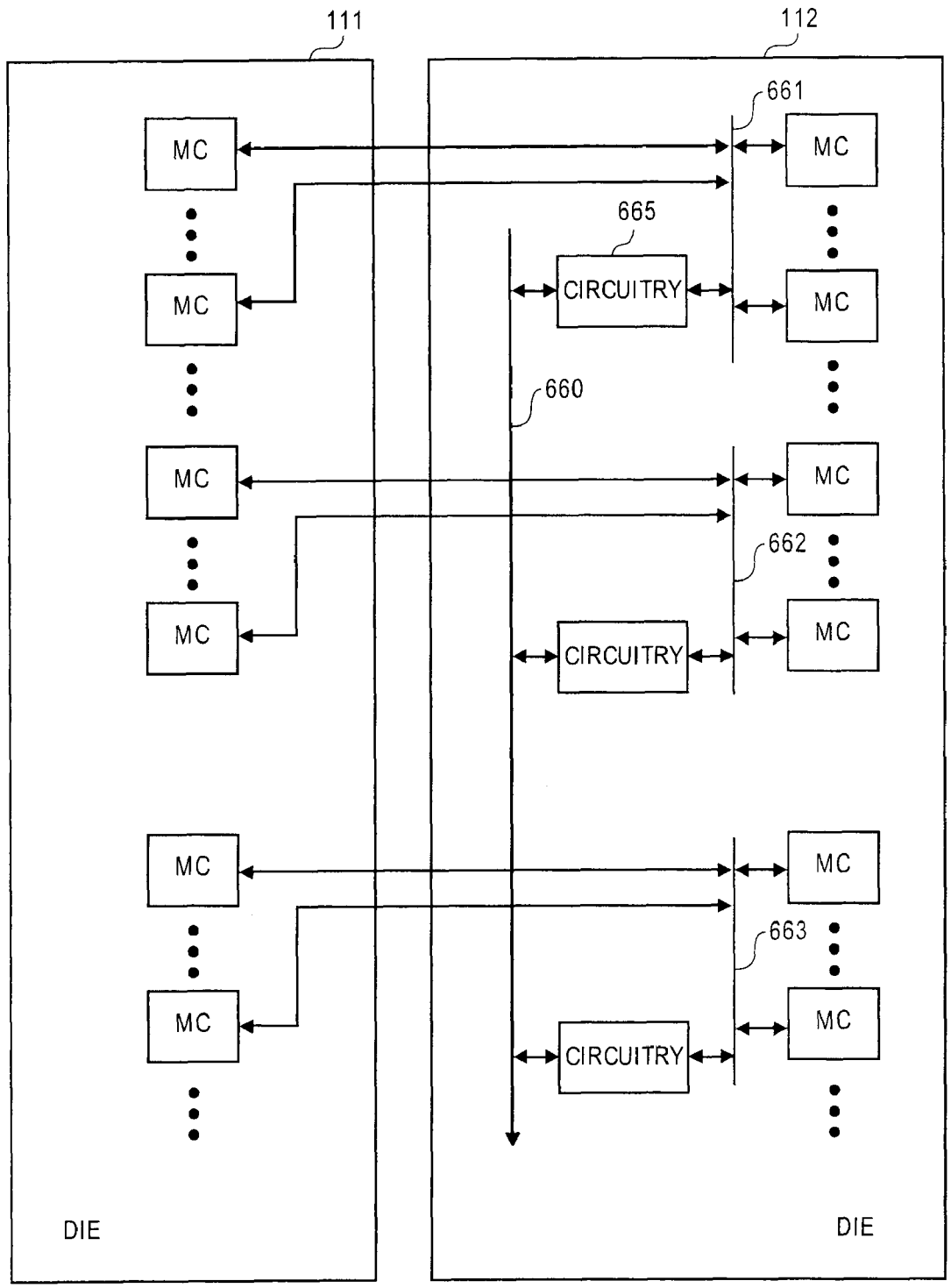
FIG. 6 illustrates, for one embodiment, a block diagram of memory cells on two dice with one die including a shared local bit line to conduct digital data signals for memory cells on both dice.

Die 112 for one embodiment may include one or more shared local bit lines. As illustrated in FIG. 6, a plurality of memory cells of die 111 for one embodiment may be coupled to a shared local bit line 661 of die 112, and a plurality of memory cells of die 112 for one embodiment may be coupled to shared local bit line 661. Memory cells of die 111 and die 112 may be coupled to shared local bit line 661 in any suitable manner. Shared local bit line 661 for one embodiment may generally correspond to shared line 125 of FIGS. 1, 2, and 4. Die 112 for one embodiment may include any suitable circuitry 665 to transmit on another bit line 660 one or more digital data signals corresponding to one or more digital data signals on shared local bit line 661 and/or to transmit on shared local bit line 661 one or more digital data signals corresponding to one or more digital data signals on bit line 660. Such circuitry for one embodiment may include any suitable switching, driving, and/or buffer circuitry. Bit line 660 for one embodiment may be on die 112.

Bit line 660 for one embodiment may be a global bit line to conduct digital data signals for a plurality of shared local bit lines coupled to memory cells on both die 111 and die 112. As illustrated in FIG. 6, die 111 for one embodiment may also have a plurality of memory cells coupled to one or more other shared local bit lines of die 112, such as shared local bit lines 662 and 663 for example. Die 112 for one embodiment may also have a plurality of memory cells coupled to one or more other shared local bit lines of die 112. Die 112 for one embodiment may include any suitable circuitry to transmit on bit line 660 one or more digital data signals corresponding to one or more digital data signals on one or more shared local bit lines and/or to transmit on one or more shared local bit lines one or more digital data signals corresponding to one or more digital data signals on bit line 660. Such circuitry for one embodiment may include any suitable switching, driving, and/or buffer circuitry.

Memory cells of die 111 and die 112 that are coupled to the same shared local bit line for one embodiment may generally correspond to at least a portion of a column of memory cells for memory array 102.

Figure 7:
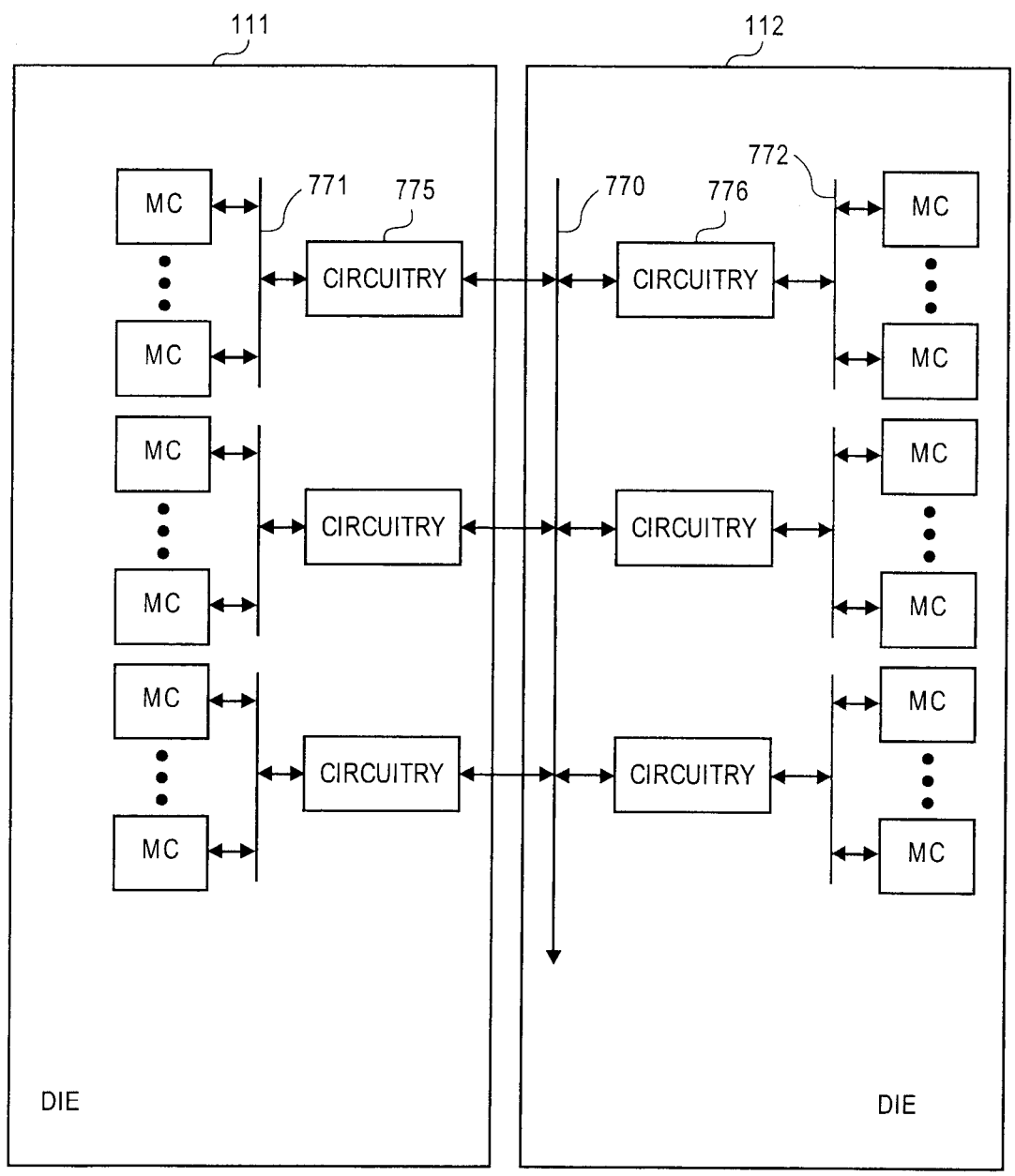
FIG. 7 illustrates, for one embodiment, a block diagram of memory cells on two dice with one die including a shared global bit line to conduct digital data signals for memory cells on both dice.

Die 112 for one embodiment may include one or more shared global bit lines. As illustrated in FIG. 7, a plurality of memory cells of die 111 for one embodiment may be coupled to a shared global bit line 770 of die 112, and a plurality of memory cells of die 112 for one embodiment may be coupled to shared global bit line 770. Memory cells of die 111 and die 112 may be coupled to shared global bit line 770 in any suitable manner. Shared global bit line 770 for one embodiment may generally correspond to shared line 125 of FIGS. 1, 3, and 4.

Memory cells of die 111 for one embodiment may be coupled to one or more local bit lines on die 111, such as local bit line 771 for example, and one or more of such local bit line(s) may be coupled to shared global bit line 770. Die 111 for one embodiment may include any suitable circuitry, such as circuitry 775 for example, to transmit on one or more local bit lines one or more digital data signals corresponding to one or more digital data signals on shared global bit line 770 and/or to transmit on shared global bit line 770 one or more digital data signals corresponding to one or more digital data signals on one or more local bit lines. Such circuitry for one embodiment may include any suitable switching, driving, and/or buffer circuitry.

Memory cells of die 112 for one embodiment may be coupled to one or more local bit lines on die 112, such as local bit line 772 for example, and one or more of such local bit line(s) may be coupled to shared global bit line 770. Die 112 for one embodiment may include any suitable circuitry, such as circuitry 776 for example, to transmit on one or more local bit lines one or more digital data signals corresponding to one or more digital data signals on shared global bit line 770 and/or to transmit on shared global bit line 770 one or more digital data signals corresponding to one or more digital data signals on one or more local bit lines. Such circuitry for one embodiment may include any suitable switching, driving, and/or buffer circuitry.

Shared Control Lines

Die 112 for one embodiment may include one or more shared control lines for memory array 102 to conduct digital control signals for memory cells on both die 111 and die 112.

Figure 8:
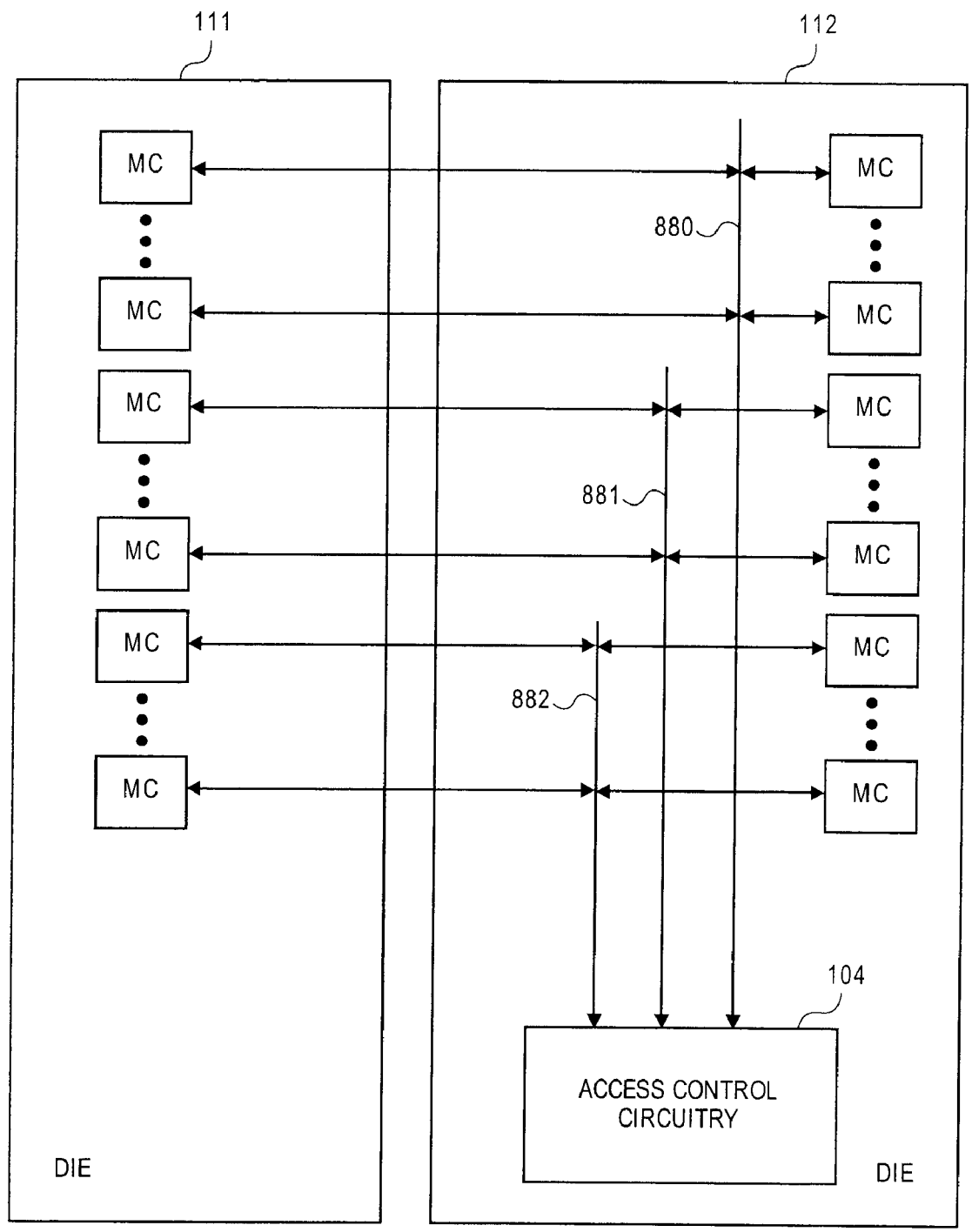
FIG. 8 illustrates, for one embodiment, a block diagram of memory cells on two dice with one die including a shared control line to conduct digital control signals for memory cells on both dice.

As illustrated in FIG. 8, a plurality of memory cells of die 111 for one embodiment may be coupled to a shared control line 880 of die 112 in any suitable manner to transmit and/or receive one or more digital control signals, and a plurality of memory cells of die 112 for one embodiment may be coupled to shared control line 880 in any suitable manner to transmit and/or receive one or more digital control signals.

Access control circuitry 104 for one embodiment may be coupled to transmit one or more digital control signals on shared control line 880 to control one or more memory cells on die 111 and/or die 112 in any suitable manner. Access control circuitry 104 for one embodiment may be coupled to transmit one or more digital control signals on shared control line 880 to select one or more memory cells on die 111 and/or die 112 for access.

Access control circuitry 104 for one embodiment may be coupled to receive one or more digital control signals on shared control line 880 from one or more memory cells on die 111 and/or die 112. One or more memory cells on die 111 and/or die 112 for one embodiment may be coupled to transmit one or more match signals on shared control line 880 to access control circuitry 104, for example where memory circuitry 100 for one embodiment may have a content addressable memory architecture.

Shared control line 880 for one embodiment may generally correspond to shared line 125 of FIGS. 1, 2, and 4.

As illustrated in FIG. 8, die 111 for one embodiment may also have a plurality of memory cells coupled to one or more other shared control lines of die 112, such as shared control lines 881 and 882 for example, coupled to access control circuitry 104. Die 112 for one embodiment may also have a plurality of memory cells coupled to one or more other shared control lines of die 112 coupled to access control circuitry 104.

Memory cells of die 111 and die 112 that are coupled to the same shared control line for one embodiment may generally correspond to at least a portion of a row of memory cells for memory array 102.

Example Operation

Access control circuitry 104 may control access to memory cells of memory array 102 in any suitable manner. Access control circuitry 104 for one embodiment may control access to memory cells of memory array 102 in accordance with a flow diagram 900 of FIG. 9.

Figure 9:
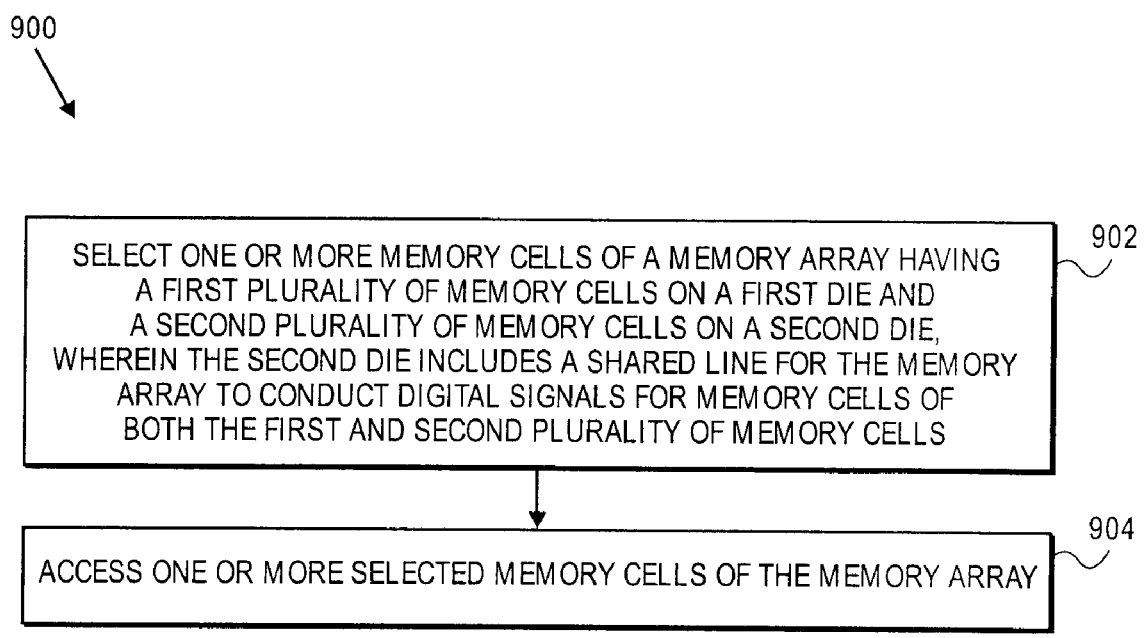
FIG. 9 illustrates, for one embodiment, a flow diagram to select and access one or more memory cells of a memory array having memory cells on two dice with one die including a shared line to conduct digital signals for memory cells on both dice.

As illustrated in FIG. 9, access control circuitry 104 for one embodiment may select for block 902 one or more memory cells of memory array 102 having a first plurality of memory cells on die 111 and a second plurality of memory cells on die 112. Die 112 for one embodiment may include a shared line for memory array 102 to conduct digital signals for memory cells of both the first and second plurality of memory cells. Access control circuitry 104 for one embodiment for block 902 may use the shared line to conduct one or more digital control signals to select one or more memory cells.

Access control circuitry 104 for one embodiment may access for block 904 one or more selected memory cells of memory array 102. Access control circuitry 104 for one embodiment for block 904 may use the shared line to conduct one or more digital data signals in reading or writing a selected memory cell. Access control circuitry 104 for one embodiment for block 904 may access one or more selected memory cells to compare data and use the shared line to conduct one or more match signals.

Example System

Figure 10:
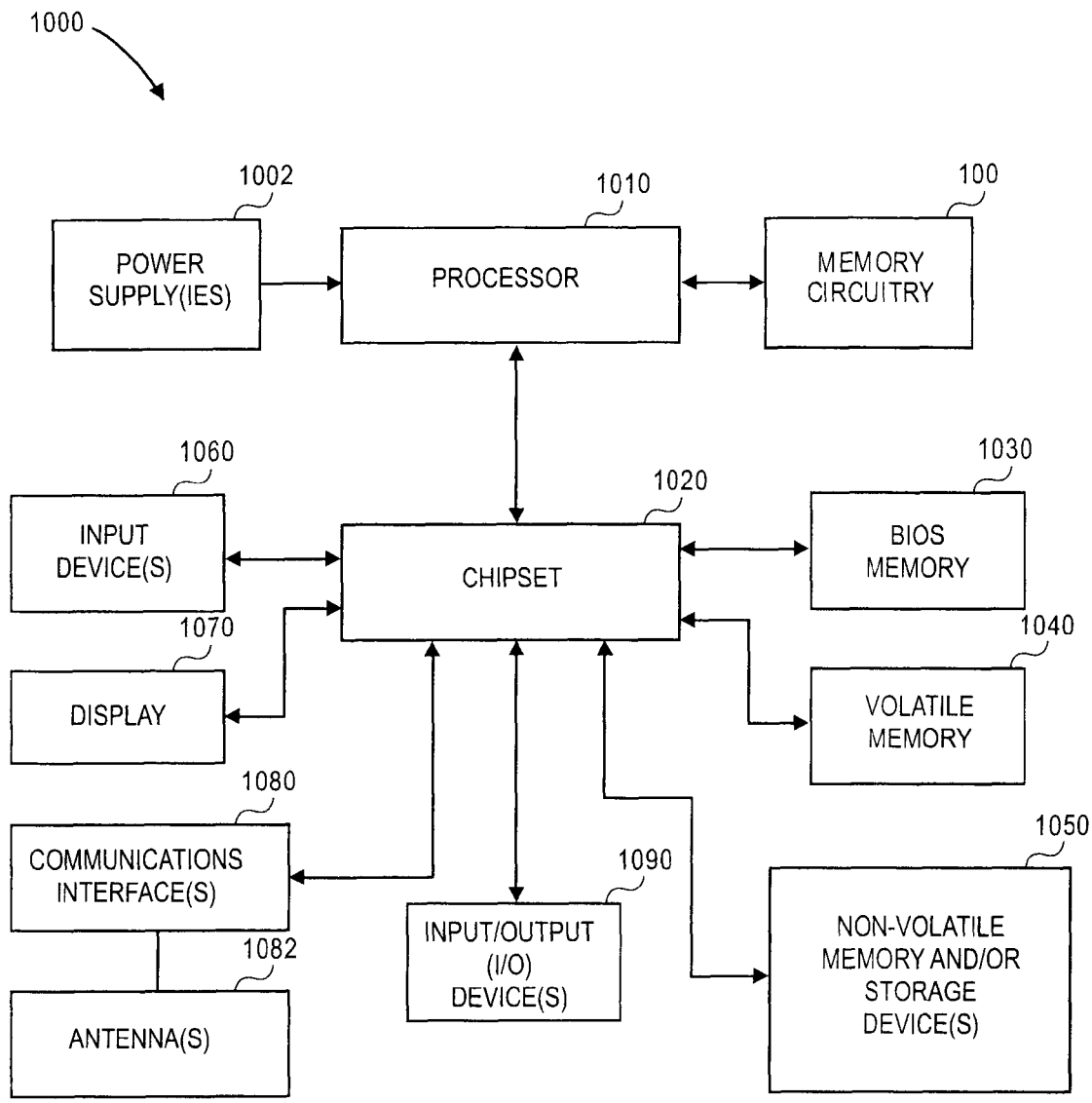
FIG. 10 illustrates, for one embodiment, a block diagram of an example system comprising a processor and memory circuitry including a memory array having memory cells on two dice with one die including a shared line to conduct digital signals for memory cells on both dice.

Memory circuitry 100 may be used in any suitable system. FIG. 10 illustrates, for one embodiment, an example system 1000 comprising a processor 1010 and memory circuitry 100. Processor 1010 for one embodiment may be formed separately from any die having circuitry for memory circuitry 100. Processor 1010 for one embodiment may be formed at least in part on only one die having circuitry for memory circuitry 100. Processor 1010 for one embodiment may be formed at least in part on two dice having circuitry for memory circuitry 100. Memory circuitry 100 for one embodiment may serve as cache memory for at least processor 1010. Memory circuitry 100 for one embodiment may serve as a register file for processor 1010, and processor 1010 for one embodiment may have other memory circuitry for cache memory. System 1000 for another embodiment may include multiple processors one or more of which may have similar memory circuitry.

Processor 1010 for one embodiment may be coupled to receive power from one or more power supplies 1002. Power supply(ies) 1002 for one embodiment may include one or more energy cells, such as a battery and/or a fuel cell for example. Power supply(ies) 1002 for one embodiment may include an alternating current to direct current (AC-DC) converter. Power supply(ies) 1002 for one embodiment may include a DC-DC converter. Power supply(ies) 1002 for one embodiment may include one or more voltage regulators to help supply power to processor 1010.

System 1000 for one embodiment may also include a chipset 1020 coupled to processor 1010, a basic input/output system (BIOS) memory 1030 coupled to chipset 1020, volatile memory 1040 coupled to chipset 1020, non-volatile memory and/or storage device(s) 1050 coupled to chipset 1020, one or more input devices 1060 coupled to chipset 1020, a display 1070 coupled to chipset 1020, one or more communications interfaces 1080 coupled to chipset 1020, and/or one or more other input/output (I/O) devices 1090 coupled to chipset 1020.

Chipset 1020 for one embodiment may include any suitable interface controllers to provide for any suitable communications link to processor 1010 and/or to any suitable device or component in communication with chipset 1020.

Chipset 1020 for one embodiment may include a firmware controller to provide an interface to BIOS memory 1030. BIOS memory 1030 may be used to store any suitable system and/or video BIOS software for system 1000. BIOS memory 1030 may include any suitable non-volatile memory, such as a suitable flash memory for example. BIOS memory 1030 for one embodiment may alternatively be included in chipset 1020.

Chipset 1020 for one embodiment may include one or more memory controllers to provide an interface to volatile memory 1040. Volatile memory 1040 may be used to load and store data and/or instructions, for example, for system 1000. Volatile memory 1040 may include any suitable volatile memory, such as suitable dynamic random access memory (DRAM) for example. Processor 1010 for one embodiment may use memory circuitry 100 to store data and/or instructions stored or to be stored in volatile memory 1040, for example, for faster access to such data and/or instructions.

Chipset 1020 for one embodiment may include a graphics controller to provide an interface to display 1070. Display 1070 may include any suitable display, such as a cathode ray tube (CRT) or a liquid crystal display (LCD) for example. The graphics controller for one embodiment may alternatively be external to chipset 1020.

Chipset 1020 for one embodiment may include one or more input/output (I/O) controllers to provide an interface to non-volatile memory and/or storage device(s) 1050, input device(s) 1060, communications interface(s) 1080, and/or I/O devices 1090.

Non-volatile memory and/or storage device(s) 1050 may be used to store data and/or instructions, for example. Non-volatile memory and/or storage device(s) 1050 may include any suitable non-volatile memory, such as flash memory for example, and/or may include any suitable non-volatile storage device(s), such as one or more hard disk drives (HDDs), one or more compact disc (CD) drives, and/or one or more digital versatile disc (DVD) drives for example.

Input device(s) 1060 may include any suitable input device(s), such as a keyboard, a mouse, and/or any other suitable cursor control device.

Communications interface(s) 1080 may provide an interface for system 1000 to communicate over one or more networks and/or with any other suitable device. Communications interface(s) 1080 may include any suitable hardware and/or firmware. Communications interface(s) 1080 for one embodiment may include, for example, a network adapter, a wireless network adapter, a telephone modem, and/or a wireless modem. For wireless communications, communications interface(s) 1080 for one embodiment may use one or more antennas 1082.

I/O device(s) 1090 may include any suitable I/O device(s) such as, for example, an audio device to help convert sound into corresponding digital signals and/or to help convert digital signals into corresponding sound, a camera, a camcorder, a printer, and/or a scanner.

Although described as residing in chipset 1020, one or more controllers of chipset 1020 may be integrated with processor 1010, allowing processor 1010 to communicate with one or more devices or components directly. As one example, one or more memory controllers for one embodiment may be integrated with processor 1010, allowing processor 1010 to communicate with volatile memory 1040 directly.

In the foregoing description, example embodiments have been described. Various modifications and changes may be made to such embodiments without departing from the scope of the appended claims. The description and drawings are, accordingly, to be regarded in an illustrative rather than a restrictive sense.

What is claimed is:

1. An apparatus comprising:
a first die including a first plurality of memory cells for a memory array; and
a second die including a second plurality of memory cells for the memory array, the second die including a shared line for the memory array to conduct digital signals for memory cells of both the first and second plurality of memory cells.

2. The apparatus of claim 1, wherein at least a portion of one of the first and second dice is positioned over at least a portion of another one of the first and second dice and coupled to the other one of the first and second dice to couple memory cells of the first plurality of memory cells of the first die to the shared line of the second die.

3. The apparatus of claim 2, wherein memory cells of the first plurality of memory cells of the first die are coupled to the shared line of the second die with one or more via interconnects.

4. The apparatus of claim 1, wherein memory cells of the first plurality of memory cells of the first die are separately coupled to the shared line of the second die at different respective positions along the shared line.

5. The apparatus of claim 1, wherein memory cells of the second plurality of memory cells of the second die are separately coupled to the shared line of the second die at different respective positions along the shared line.

6. The apparatus of claim 1, wherein the first die includes another line, wherein memory cells of the first plurality of memory cells of the first die are separately coupled to the other line of the first die at different respective positions along the other line, and wherein the other line is coupled to the shared line of the second die.

7. The apparatus of claim 1, wherein the second die includes another line, wherein memory cells of the second plurality of memory cells of the second die are separately coupled to the other line of the second die at different respective positions along the other line, and wherein the other line is coupled to the shared line of the second die.

8. The apparatus of claim 1, wherein the first die includes another line coupled to memory cells of the first plurality of memory cells, the other line to extend the shared line across the first and second dice.

9. The apparatus of claim 1, wherein the first and second dice are in a same package.

10. The apparatus of claim 1, wherein the shared line is a bit line to conduct digital data signals for memory cells of both the first and second plurality of memory cells.

11. The apparatus of claim 1, wherein the shared line is to conduct digital control signals for memory cells of both the first and second plurality of memory cells.

12. The apparatus of claim 11, wherein one of the first and second dice includes control circuitry to transmit one or more digital control signals on the shared line to select one or more memory cells of the first plurality of memory cells and/or the second plurality of memory cells.

13. The apparatus of claim 11, wherein one or more memory cells of the first plurality of memory cells and/or the second plurality of memory cells are to transmit one or more match signals on the shared line.

14. A method comprising:
selecting one or more memory cells of a memory array having a first plurality of memory cells on a first die and a second plurality of memory cells on a second die, wherein the second die includes a shared line for the memory array to conduct digital signals for memory cells of both the first and second plurality of memory cells; and
accessing one or more selected memory cells of the memory array.

15. The method of claim 14, wherein at least a portion of one of the first and second dice is positioned over at least a portion of another one of the first and second dice and coupled to the other one of the first and second dice to couple memory cells of the first plurality of memory cells of the first die to the shared line of the second die.

16. The method of claim 14, wherein the accessing includes using the shared line to conduct one or more digital data signals in reading or writing a selected memory cell.

17. The method of claim 14, wherein the selecting includes using the shared line to conduct one or more digital control signals to select one or more memory cells.

18. The method of claim 14, wherein the accessing includes accessing one or more selected memory cells to compare data and using the shared line to conduct one or more match signals.

19. A system comprising:
a processor;
memory circuitry including a memory array having a first plurality of memory cells on a first die and a second plurality of memory cells on a second die, wherein the second die includes a shared line for the memory array to conduct digital signals for memory cells of both the first and second plurality of memory cells; and
volatile memory.

20. The system of claim 19, wherein at least a portion of one of the first and second dice is positioned over at least a portion of another one of the first and second dice and coupled to the other one of the first and second dice to couple memory cells of the first plurality of memory cells of the first die to the shared line of the second die.

21. The system of claim 19, wherein the shared line is a bit line to conduct digital data signals for memory cells of both the first and second plurality of memory cells.

22. The system of claim 19, wherein the shared line is to conduct digital control signals for memory cells of both the first and second plurality of memory cells.

* * * * *